(12) United States Patent  
Lee (10) Patent No.: US 8,274,030 B2
(45) Date of Patent: Sep. 25, 2012

(54) SOLAR CONCENTRATOR AND PORTABLE TRACKING DEVICE

(75) Inventor: Gregory Jin-keng Lee, Belmont, MA (US)

(73) Assignee: D-Rev Design for the Other Ninety Percent, Palo Alto, CA (US)

(*) Notice: Subject to any disclaimer, the term of this patent is extended or adjusted under 35 U.S.C. 154(b) by 263 days.

(21) Appl. No.: 12/561,172

(22) Filed: Sep. 16, 2009

(65) Prior Publication Data

US 2010/0236539 A1 Sep. 23, 2010

Related U.S. Application Data

(60) Provisional application No. 61/097,321, filed on Sep. 16, 2008, provisional application No. 61/097,304, filed on Sep. 16, 2008.

(51) Int. Cl.
*G01C 21/02* (2006.01)
*H02N 6/00* (2006.01)
*F24J 2/08* (2006.01)

(52) U.S. Cl. ............ 250/203.4; 136/246; 126/684

(58) Field of Classification Search ............ 250/203.4; 136/244, 246, 251; 126/576, 684
See application file for complete search history.

(56) References Cited

U.S. PATENT DOCUMENTS

| | | | |
|---|---|---|---|
| 3,578,622 A | 5/1971 | Brown et al. |
| 3,959,056 A | 5/1976 | Caplan |
| 3,996,917 A | 12/1976 | Trihey |
| 4,000,734 A | 1/1977 | Matlock et al. |
| 4,045,246 A | 8/1977 | Mlavsky et al. |
| 4,071,017 A | 1/1978 | Russell, Jr. et al. |
| 4,077,392 A | 3/1978 | Garner |
| 4,088,116 A | 5/1978 | Pastor |
| 4,099,516 A | 7/1978 | Caulier |
| 4,106,484 A | 8/1978 | Dame |
| 4,108,154 A | 8/1978 | Nelson |
| 4,115,177 A | 9/1978 | Nelson |
| 4,127,926 A | 12/1978 | White |
| 4,132,219 A | 1/1979 | Cohen et al. |
| 4,135,493 A | 1/1979 | Kennedy |
| 4,173,397 A | 11/1979 | Simpson |
| 4,175,540 A | 11/1979 | Roantree et al. |
| 4,193,391 A | 3/1980 | White |
| 4,198,826 A | 4/1980 | Chromie |
| 4,220,136 A | 9/1980 | Penney |
| 4,223,174 A | 9/1980 | Moeller |
| 4,230,094 A | 10/1980 | Szulmayer |
| 4,235,224 A | 11/1980 | Yarwood et al. |
| 4,240,406 A | 12/1980 | Hutchison |
| 4,241,726 A | 12/1980 | Doebel |
| 4,243,019 A | 1/1981 | Severson |
| 4,243,301 A | 1/1981 | Powell |
| 4,249,514 A | 2/1981 | Jones |
| 4,256,091 A | 3/1981 | Hallows |
| 4,261,335 A | 4/1981 | Balhorn |

(Continued)

*Primary Examiner* — Georgia Y Epps
*Assistant Examiner* — Don Williams
(74) *Attorney, Agent, or Firm* — Parsons Behle & Latimer (57) ABSTRACT

The present disclosure relates to a concentrator, particularly a terrestrial solar concentrator to harness the sun's energy, and a tracking system. The concentrator includes a parabolic or other curved reflective surface and an absorber positioned at the focus of the curved reflective surface. Parabolic ribs give shape to the reflective surface. The tracking system includes a rotating, swiveling, or pivoting joint. One or more cables attach to the tracking system. Selectively applying tension to the cables causes the tracking system to rotate, swivel, or pivot at the joint to track an object.

14 Claims, 5 Drawing Sheets

U.S. PATENT DOCUMENTS

| | | |
|---|---|---|
| 4,263,893 A | 4/1981 | Pavlak et al. |
| 4,267,824 A | 5/1981 | O'Halloran |
| 4,268,332 A | 5/1981 | Winders |
| 4,276,122 A | 6/1981 | Snyder |
| 4,276,873 A | 7/1981 | Uroshevich |
| 4,290,418 A | 9/1981 | Uroshevich |
| 4,293,192 A | 10/1981 | Bronstein |
| 4,297,003 A | 10/1981 | Hutchison |
| 4,313,422 A | 2/1982 | McEntee |
| 4,326,773 A | 4/1982 | Colas |
| 4,340,031 A | 7/1982 | Niedermeyer |
| 4,372,027 A | 2/1983 | Hutchison |
| 4,372,651 A | 2/1983 | Hutchison |
| 4,390,241 A | 6/1983 | Trihey |
| 4,408,595 A | 10/1983 | Broyles et al. |
| 4,416,263 A | 11/1983 | Niedermeyer |
| 4,423,719 A | 1/1984 | Hutchison |
| 4,432,343 A | 2/1984 | Riise et al. |
| 4,444,468 A | 4/1984 | Mori |
| 4,493,313 A | 1/1985 | Eaton |
| 4,515,148 A | 5/1985 | Boy-Marcotte et al. |
| 4,571,812 A | 2/1986 | Gee |
| 4,611,575 A | 9/1986 | Powell |
| 4,678,292 A | 7/1987 | Miyatani et al. |
| 4,820,033 A | 4/1989 | Sick |
| 5,069,540 A | 12/1991 | Gonder |
| 5,237,337 A | 8/1993 | Hutchison |
| 5,325,844 A | 7/1994 | Rogers et al. |
| 5,365,920 A | 11/1994 | Lechner |
| 5,964,216 A | 10/1999 | Hoffschmidt |
| 6,035,850 A | 3/2000 | Deidewig et al. |
| 6,155,250 A | 12/2000 | Mieda et al. |
| 6,276,359 B1 | 8/2001 | Frazier |
| 6,563,040 B2 * | 5/2003 | Hayden et al. ............... 136/244 |
| 6,994,082 B2 | 2/2006 | Hochberg et al. |
| 7,343,913 B2 | 3/2008 | Niedermeyer |
| 2002/0047814 A1 * | 4/2002 | Yeomans .................. 343/912 |
| 2007/0221209 A1 | 9/2007 | Neubauer et al. |

* cited by examiner

SOLAR CONCENTRATOR AND PORTABLE TRACKING DEVICE

CROSS REFERENCE TO RELATED APPLICATIONS

This application claims priority under 35 USC §119 to U.S. Provisional Patent Ser. No. 61/097,321, filed on Sep. 16, 2008 and titled "Solar Concentrator," and to U.S. Provisional Patent Ser. No. 61/097,304, filed on Sep. 16, 2008 and titled "Tracking Device," the entire contents of which are hereby incorporated by reference.

BACKGROUND

The present application relates generally to concentrators and tracking devices and more specifically to a terrestrial solar concentrator and a light-weight tracking system.

Developing cost-competitive alternative energy sources is of paramount importance with rising concerns over global warming and energy independence. Solar energy is abundant and can easily meet the world's energy needs. However, conventional solar panels that convert sunlight into electricity are too expensive to gain widespread acceptance. Solar concentrators attempt to reduce the cost of solar electricity by putting more solar energy on a given panel area. Solar trackers attempt to improve the functioning of solar concentrators by keeping them pointed at the sun.

However, existing concentrators often remain too costly to gain widespread adoption. Furthermore, many existing systems are designed for utility scale power generation because larger systems can distribute the costs of tracking, cooling, and power inversion. Current methods of generating off-grid power include diesel engines, which are not easily portable, and do not scale down for personal use, and small solar arrays, which are too expensive, and often do not generate enough power.

Tracking can increase the efficiency of many systems, including solar cells. While apparatuses for tracking and for pointing in two dimensions are well known, current systems are bulky and expensive.

SUMMARY

To address these deficiencies, the present application discloses a tracking system and a novel concentrator design that are simple, relatively inexpensive, small-scale, and portable.

The following presents a simplified summary of the disclosure in order to provide a basic understanding of some aspects disclosed herein. This summary is not an exhaustive overview, and it is not intended to identify key or critical elements of the disclosure or to delineate the scope of the disclosure. Its sole purpose is to present some concepts in a simplified form as a prelude to the more detailed description that is discussed later.

In one embodiment, a tracking system includes a platform configured to accommodate an object, at least one support leg attached to the platform, and at least one flexible cable attached to the platform. The at least one support leg has a pivoting anchor point. The at least one flexible cable passes through a fixed anchor point. The platform is adapted to pivot at the pivoting anchor point in response to a tension applied to the at least one flexible cable.

In another embodiment, a portable solar concentrator includes a reflective surface, a reinforcement sheet, a plurality of curved ribs, an absorber, and a support stand. The reflective surface has a curved shape and at least one focal point above the reflective surface. The reflective surface includes a flexible sheet of reflective material. The reinforcement sheet supports the reflective material and is stiffer than the reflective material. The plurality of curved ribs are attached to the reinforcement sheet. The absorber is located at the at least one focal point. The support stand is hingedly connected to the curved ribs. The curved ribs, reinforcement sheet, and reflective material may swivel relative to the support stand on a roughly horizontal axis. The portable solar concentrator is adapted to track a target by applying tension to cables attached to the concentrator.

In another embodiment, a method of collecting solar energy includes assembling a portable solar concentrator at a first location, collecting concentrated solar energy at the first location using the portable solar concentrator, transporting the portable solar concentrator to a second location, and collecting concentrated solar energy at the second location using the portable solar concentrator.

These and other embodiments of the present disclosure will be discussed more fully in the description. The features, functions, and advantages can be achieved independently in various embodiments of the disclosure, or may be combined in yet other embodiments.

BRIEF DESCRIPTION OF THE DRAWINGS

This disclosure may be understood by reference to the following description taken in conjunction with the accompanying drawings, in which like reference numerals identify like elements, and in which.

While the disclosed embodiments are susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

In the following detailed description, reference is made to the accompanying drawings that form a part hereof, and in which is shown by way of illustration specific embodiments in which the disclosed apparatus may be practiced. These embodiments are described in sufficient detail to enable those skilled in the art to practice the disclosure, and it is to be understood that other embodiments may be utilized and that various changes may be made without departing from the spirit and scope of the disclosure. The following detailed description is, therefore, not to be taken in a limiting sense.

The present disclosure relates to tracking systems and solar concentrator systems to collect solar energy. A tracking system can keep an object pointed at a stationary or moving target, such as the sun. A tracking system may be used with conventional or portable photovoltaic arrays, solar concentrators, telescopes, cameras, satellite dishes, and other devices that can benefit from a pointing system.

Figure 1:
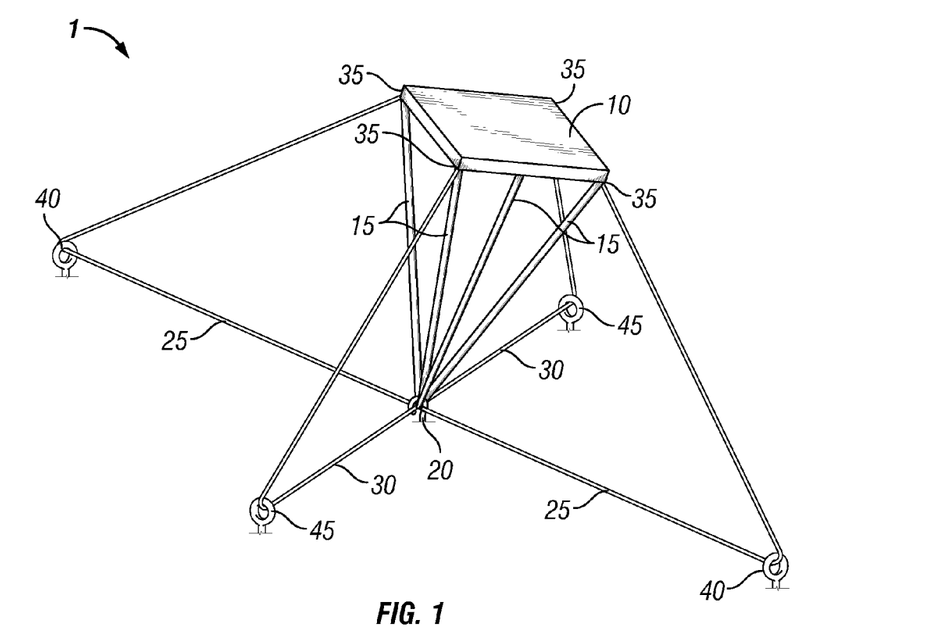
FIG. 1 depicts a dual-axis tracking system.
Figure 2:
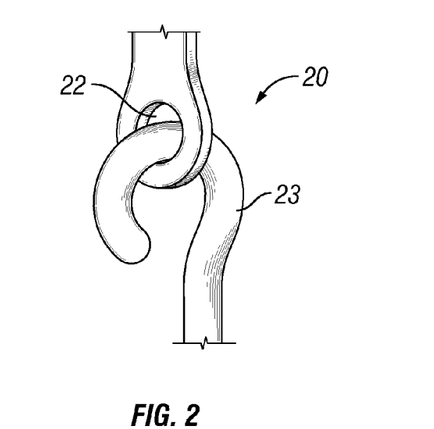
FIG. 2 depicts a central anchor point of a dual-axis tracking system.

In the embodiment shown in FIG. 1, a dual-axis tracking system 1 comprises a platform 10. A plurality of stiff supports 15 hold the platform 10 off the ground. Each support 15 has a platform end and a pivot end. The platform end of each support 15 is secured into slots on the platform 10. The pivot ends of the supports 15 join at a pivoting anchor point 20. Referring now to FIG. 2, the pivoting anchor point 20 comprises a hook-shaped stake 23 driven into the ground. The pivot ends of the supports 15 join to form an eyehole 22. The eyehole 22 receives the hook-shaped portion of the stake 23 and rests on the curved end thereof to form the pivot point 20. The stake 23 is vertically driven, drilled, screwed, or otherwise placed into the ground or other mounting surface so that the stake 23 is roughly perpendicular to the plane of the mounting surface. The shaft of the stake 23 is long enough that it can act as an anchor for the dual-axis tracking system 1.

Referring again to FIG. 1, flexible cables 25 and 30 attach at opposing points 35 of the platform 10. Anchors 40 are driven into the ground on opposing sides of the system 1 from each other, in line with two corresponding cable connection points 35 on opposite sides of the platform 10. Likewise, anchors 45 are driven into the ground on opposing sides of the system 1 from each other and offset from anchors 40, in line with corresponding cable connection points 35 on opposite sides of the platform 10. The anchors 40 and 45 each have an eyehole dimensioned to slidably receive cables 25 and 30. Cable 25 loops through both anchors 40. Cable 30 loops through anchors 45, which are offset from anchors 40; thus cable 30 is roughly perpendicular to the cable 25. Cables 25 and 30 pass under the hook member of stake 23, so as to not interfere with the pivoting action of the eyehole 22 on the stake 23.

In some embodiments of the dual-axis tracking system 1, the platform 10 represents any object that may benefit from tracking, such as, for example, a solar collector, a camera, a telescope, a satellite dish, or other observation equipment having suitable shape and size. In some embodiments, such objects may be placed on the platform 10, and in other embodiments, such objects may replace the platform 10. In some embodiments, the platform 10 is configured to accommodate such objects. In some embodiments, the platform may accommodate objects with connecting hardware such as thumbscrews or other fasteners to secure the objects to the platform 10.

In some embodiments of the dual-axis tracking system 1, the stiff supports 15 are manufactured from composite materials, such as carbon fiber, metal or metal alloys, such as aluminum, or wood, such as bamboo. It is to be understood that the supports 15 may be manufactured of any material that has sufficient stiffness and strength to hold up the weight of the platform 10.

The embodiment of the dual-axis tracking system 1 depicted in FIG. 1 includes four stiff supports 15. Other embodiments may include any number of supports 15 as needed. The number of supports 15 may be dictated by the size, shape, or weight of the platform 10 or the object placed thereon, or other practical considerations. In some embodiments, the supports 15 are attached to the platform 10 adhesively, with fasteners, mechanical clips, or the like. Alternatively, the supports 15 can be press fit or attached to the platform 10 with other such mechanical means of connection.

In other embodiments, each of the plurality of supports 15 has one eyehole 22 at its pivot end. In such embodiments, the plurality of eyeholes 22 all receive the hook member of the stake 23 and rest on the curved end thereof to form the pivot point 20. In other embodiments, each pair of supports 15 combine to form an eyehole 22. Alternatively, any number of supports 15 may be joined at their pivot ends to form any number of eyeholes 22.

In some embodiments of the dual-axis tracking system 1, eyehole loops 22 are made of metal. In other embodiments, the eyehole loops 22 are manufactured from composites, such as carbon fiber, metals or metal alloys, or any other material that has sufficient strength to support the platform 10. The eyeholes 22 may be rigid or flexible, such as an eyehole 22 made from a loop of cable or the like.

In some embodiments, the pivoting anchor point 20 consists of a ball pivot or other such pivot means that allow two degree of freedom rotation. In other embodiments, the supports 15 are simply attached to each other at the pivot ends of the supports 15 and placed on the ground or other mounting surface, to pivot against the mounting surface. In other embodiments, the object includes an integral support means having a pivot point 20. In such embodiments, the platform 10 and supports 15 are omitted. In other embodiments, the platform 10 rotates about more than one pivot point, such as if the platform 10 is a cube. Such a cubic platform 10 may pivot around one of its corner edges from zero to ninety degrees on a first inclination angle, lie flat on the ground at ninety degrees, and/or rotate about a transverse corner edge from zero to ninety degrees at a second inclination angle transverse to the first inclination angle. In other embodiments, the platform 10 is at least partially spherical, such as with an inflatable solar concentrator. A spherical platform 10 can have a varying contact patch with the ground as it rotates.

In some embodiments of the dual-axis tracking system 1, cables 25 and 30 are made of nylon strands. In other embodiments, cables 25 and 30 are made of other synthetic strands, metal strands, natural fiber strands, combinations thereof, or any flexible tensile element. Cables 25 and 30 may be made of twisted strands, braided strands, or other cable construction styles. The material and construction makeup of cables 25 and 30 may be selected based on the desired characteristics of cables 25 and 30, for example cable strength and stiffness. In some embodiments, cables 25 and 30 comprise elastic or semi-elastic cables that may stretch when tension is applied thereto.

Other embodiments comprise a platform 10 having any number of cable connection points 35 suited to the shape of the platform 10. The stakes 40 and 45 are placed to correspond with desired inclination directions. In some cases, it may be desirable for inclination angles to be normal to the edges of the platform 10 rather than the corners of the platform 10. In such cases, the stakes 40 may be placed to face edges of the platform 10 rather than corners. In such embodiments, the cables 25 and 30 are attached to the middle of each side edge of the platform 10. In other embodiments, the cables 25 and 30 comprise a "Y" split so that each cable 25 or 30 can attach to two of the corners of the platform 10. In other embodiments, the cables 25 and 30 extend from a movable anchor 40 or 45 to one or more attachment points 35 on the platform 10. Such embodiments include an actuator adapted to move the movable anchors 40 and 45. In other embodiments, the pivot point 20 is fixed in one axis so the system 1 can be used to track one axis only.

In other embodiments, anchors 40 and 45 do not include an eyehole as depicted in FIG. 1. Instead, the anchors 40 and 45 each comprise an open hook, cross-bar, or other means of allowing cables 25 and 30 to slide through the anchors 40 and 45.

In other embodiments that may be used where staking anchors 40 and 45 in the ground is not possible, two long thin eyehole supports lie on the ground under the dual-axis tracking system 1. Such eyehole supports have eyeholes 40 and 45 on each end, through which cables 25 and 30 pass, respectively. In such embodiments, the eyehole supports can be made of carbon fiber, metal, or other stiff material. The eyehole supports can be attached to the center stake 20 using a fastener, or they can be attached adhesively, or using a hole or loop in the center of the support.

In some embodiments, the cables 25 and 30 are wrapped around existing rocks, poles, trees, or other such items that can act as an anchor 40 or 45 to the cables 25 and 30. In other embodiments, loops of cable are anchored in place near the system 1 at locations corresponding to anchors 40 and 45, thereby forming anchor loops 40 and 45. Cables 25 and 30 slidably pass through the anchor loops 40 and 45, respectively.

In operation, the dual-axis tracking system 1 is used to track a target, for example, the sun. As described above, the pivoting anchor point 20 comprises an eyehole 22 on the pivoting end of the supports 15. The eyehole 22 is free to slide along the curve of the stake 23, tilting the platform 10 in one dimension defined as a first inclination angle that is normal to the plane of the eyehole 22. The eyehole 22 can spin around the hook-shaped portion of stake 23 to rotate in another dimension, defined as a second inclination angle. The first and second inclination angles are generally transverse to each other. Thus, the pivoting anchor point 20 allows for two degrees of rotation of the platform 10.

As a tension is applied to the cable 25, it pulls on one side of the platform 10 at a connecting point 35 and slacks at the opposite connecting point 35, thereby rotating the platform 10 in the first inclination angle. Pulling the cable 25 in the opposite direction results in the platform 10 rotating in the opposite direction in the first inclination angle. Pulling cable 30 likewise results in the platform 10 rotating along the second inclination angle.

One benefit of the dual-axis tracking system 1 is that the platform 10, or an object such as a solar collector placed on the platform 10, can be aligned with the axis of the sun's path. In such operation, the dual-axis tracking system 1 may be placed and anchored to align the first inclination angle with the tilt of the sun's path, so that periodic applications of tension to cable 25 may account for seasonal variations in the sun's path. The system 1 may also be placed to align the second inclination angle with the sun on its daily path. In this case, the cable 25 can be moved daily or weekly to track seasonal movement, while the cable 30 can be moved multiple times per day to track daily movement. The required tracking accuracy dictates how often the cables 25 and 30 need to be moved. In this way, the dual-axis tracking system 1 of the present disclosure simplifies sun tracking from two-axis to one-axis tracking over the course of a day and one-axis tracking over the course of a year. Alternatively, the two cables 25 and 30 can both be tensioned as often as needed, especially if sun alignment is not possible or the target is not the sun and has an unknown or unpredictable path.

In operation of embodiments of the dual-axis tracking system 1 that include elastic or semi-elastic cables 25 and 30, portions of the cables 25 and 30 may be under a maximum amount of tension when the platform 10 is upright, causing the cables 25 and 30 to stretch. As the platform 10 is tilted in inclination directions, tension in the cables 25 and 30 may be reduced, causing the cables 25 and 30 to stretch less. At extreme inclination angles, cables 25 and 30 may undergo a minimum amount of tension. Such elasticity in the cables 25 and 30 may allow the cables 25 or 30 to provide support to the tilted platform 10, thus maintaining the inclination angle of the platform 10.

Figure 3:
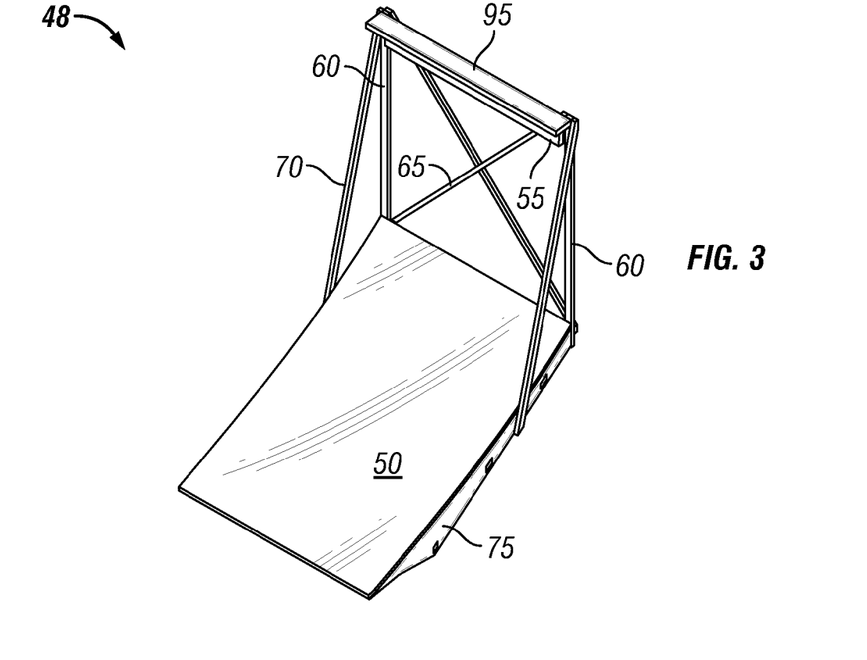
FIG. 3 is a top view of a solar concentrator system.
Figure 4:
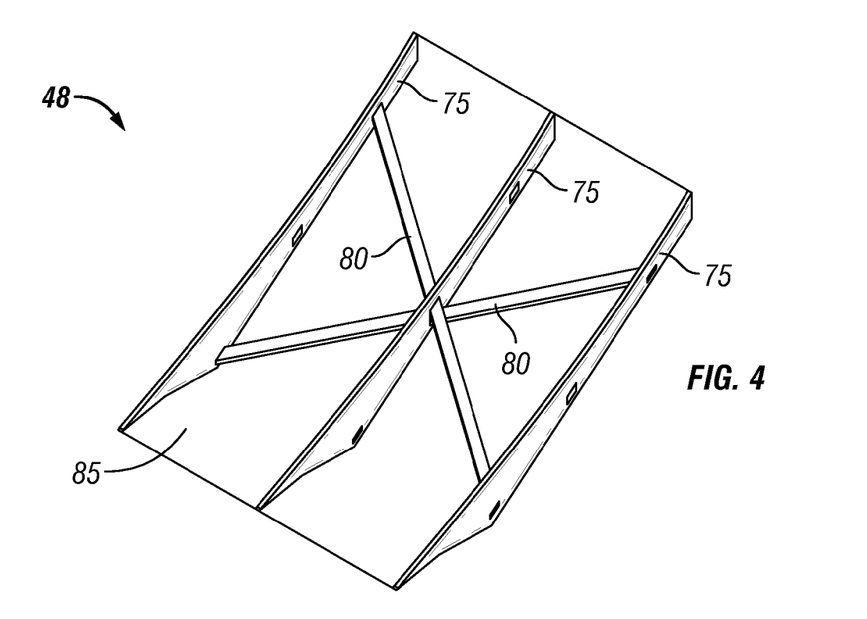
FIG. 4 is a view of the bottom of the solar concentrator system, showing a parabolic rib and support structure.
Figure 5:
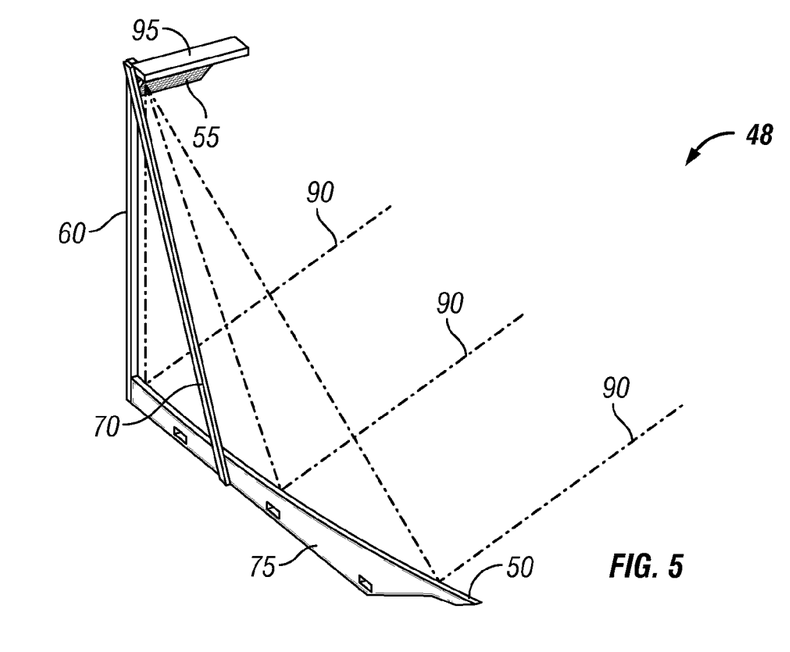
FIG. 5 is a side view of the solar concentrator system displaying incident and reflected light beam paths.

FIGS. 3-5 illustrate a solar concentrator system 48 including a reflective surface 50 having the shape of a parabolic side section. For the purposes of this disclosure, a parabolic side section is understood to mean a portion of a parabola that does not include the vertex of the parabola. In the illustrated embodiment, the reflective surface 50 focuses light on an absorber 55. A system of supports 60, 65, and 70 keeps the absorber 55 in position at the focal line of the reflective surface 50. Absorber supports 60 connect to an absorber bracket 95 that holds the absorber 55. Cross bracing supports 65 prevent the supports 60 from rotating, and truss ribs 70 prevent supports 60 from bending. Parabolic support ribs 75 form the shape of the reflective surface 50 and provide support thereto. The supports 60 and 70 are adhesively attached to parabolic support ribs 75 and absorber bracket 95. The cross braces 65 are adhesively attached to the absorber supports 60. The supports 60, 65, and 70 are made out of wood and are two-dimensional shapes, so that they can be cut from a flat sheet of material.

FIG. 4 shows an underside view of an embodiment of the solar concentrator 48. A plurality of parabolic support ribs 75 provide mechanical support to the reflective surface 50 and form the parabolic shape of the reflective surface 50. The ribs 75 have slots for accepting diagonal supports 80, which reduce twisting in the reflective surface 50. The diagonal supports 80 are cut to be flush with the outside of the parabolic ribs 75. The parabolic ribs 75 and diagonal supports 80 are manufactured out of wood and adhesively attached to each other and the reflective surface 50.

A semi-rigid support 85 comprises a thin sheet of stiff material 85 placed between the parabolic ribs 75 and the reflective surface 50 to form the backing of the reflective surface 50. This sheet 85 forms a semi-monocoque system, serving as a structural element to further rigidize the solar concentrator system 48. The reflective surface 50 comprises a sheet of reflective film, such as aluminized Mylar, which is adhesively attached to sheet 85 with the metalized side of the film against sheet 85 in order to protect the metallization from scratching.

In other embodiments of the solar concentrator 48, the reflective surface 50 and support ribs 75 form a shape other than that depicted in FIGS. 3-5. For example, the reflective surface 50 and support ribs 75 may be in the shape of a parabola with a different slope or a different parabolic section than that depicted. Alternatively, the reflective surface 50 and support ribs 75 may be in the shape of a curve or curved section of a hyperbola, spherical curve, catenary, or other curve or curve section that can concentrate light.

In some embodiments of the solar concentrator system 48, the supports 60, 65, and 70, support ribs 75, and diagonal supports 80 are made of plastic, and can be injection molded, vacuum-formed, or manufactured by any other means. In other embodiments, the supports 60, 65, 70, support ribs 75, and diagonal supports 80 are attached to each other with fasteners such as screws, nails, or thumbscrews. In other embodiments, the support pieces 60, 65, 70, 75, and 80 are press fit into slots in other support pieces. In other embodiments, the system 48 may be disassembled to allow for increased portability. It is to be understood that many additional means and arrangements of assembling the system 48 are envisioned and fall within the scope of this disclosure.

Embodiments of the solar concentrator system 48 may have any number of support ribs 75 depending on the nature of the reflective surface 50 and other desired characteristics of the system 48. For example, a relatively large and/or heavy reflective surface 50 may have five, six, or more support ribs 75, while a small and light reflective surface 50 may have only one or two support ribs 75.

Other embodiments of the solar concentrator system 48 include horizontal supports perpendicular to the parabolic ribs 75. Such horizontal supports may provide additional stiffness to the system 48 if desired. The horizontal supports can be manufactured and attached in the same manner as described in relation to the supports 60, 65, 70, 75, and 80.

In other embodiments, other suitable arrangements of supports 60, 65, 70, 75, and 80 are used. For example, the cross brace supports 65 and truss ribs 70 may be omitted, or additional supports can be added depending on the desired stiffness of the solar concentrator system 48. In other embodiments, the absorber 55 is not attached to the support ribs 75 and reflective surface 50, but is separately supported on a detached structure. In other embodiments, cables replace any of supports 60, 65, 70, or 80. Cables may serve as cross bracing by connecting opposite corners of the reflective surface 50 or other support members of the system 48.

In some embodiments of the solar concentrator 48, the sheet 85 is made of a thin sheet of plywood. In other embodiments, the sheet 85 is made of any thin flexible material such as plastic, metal, cloth, composites, or other materials.

In some embodiments of the solar concentrator 48, the adhesive securing the reflective film 50 to the sheet 85 is a spray-on adhesive, which may allow the film to move slightly so that it can be smoothed into place to form the best possible reflective surface 50. Alternatively, the film 50 can be attached by glue or tape. In other embodiments, the reflective surface 50 is stiff, and thus acts as its own mechanical support sheet 85 and reflective surface 50.

In other embodiments of the solar concentrator 48, the absorber 55 is mounted on sliders within the absorber bracket 95. The absorber 55 may thus slide laterally along the focal line of the reflective surface 50. In embodiments of the solar concentrator system 48, the absorber 55 is held by gravity within the bracket 95. In other embodiments, the absorber 55 is attached to the bracket 95 adhesively, with fasteners, clamped, or attached by other means. In other embodiments, the absorber 55 is attached directly to the supports 60, 65, and/or 70, attached to the supports 60, 65, and/or 70 with tabs, or attached by other means either to the bracket 95 or the supports 60, 65, and/or 70.

In other embodiments of the solar concentrator 48, the reflective surface 50 comprises a reflective material that is hung between vertical supports. In such embodiments, an unweighted, flexible element may form a catenary when hung between two points, which is a curve that can concentrate incident radiation. In an embodiment, the reflective surface 50 has a semi rigid backing 85 made of long thin rigid elements. These long thin rigid elements are attached to form a rectangular surface, like Venetian blinds, so that the surface bends to follow a parabola. The reflective surface 50 is attached to this curved, relatively rigid surface 85. In other embodiments, thin flexible strips of material such as string are hung to form a semi-rigid support that gives shape to the curvature of the reflective surface 50. The reflective surface 50 or backing 85 can be placed on top of these hung supports. Alternatively, the reflective surface 50 can be manufactured from any material that flexes under its own weight, such as cloth, plastic film, and the like, and hung without any backing 85.

In other embodiments, a suspended reflective surface 50 is pulled to form a parabola. Exerting a downward force at points along the hanging surface draws material of the reflective surface 50 into a parabola, which may achieve higher concentration ratios than a catenary. In such embodiments, elements exert a downward force by pulling between connection points and a horizontal member 85. The horizontal member 85 arches under the stress. The horizontal member 85 can be pulled downward to exert tension on the reflective surface 50. Alternatively, the elements can be individually tensioned, or weights hung at the connection points can exert the downward force. In such embodiments, elements are adhesively attached with cables. Alternatively, the elements are attached with fasteners, suction cups, or the like. Such elements are made of any material that can hold tension, such as metal, plastic, wood, or composites. In other embodiments, the reflective surface 50 has tabs that attach to elements, such as using a hole and a notch connection.

In another embodiment, the reflective surface 50 comprises a two-dimensional concentrator. In such an embodiment, the reflective surface 50 is constructed similarly to the embodiment disclosed in FIGS. 3-4, but includes additional parabolic ribs 75 perpendicular to the parabolic ribs 75. These additional ribs 75 can be manufactured and attached in the same means disclosed herein in reference to the support ribs 75. With this configuration, the reflective surface 50 is formed into a parabolic side section in one dimension and a parabola in another dimension, which may cause light to converge in both dimensions to a focal point rather than a focal line. In another embodiment, the reflective surface 50 has the shape of middle parabola sections in both dimensions, forming a parabolic dish collector. In yet another embodiment, the reflective surface 50 has the shape of parabolic side sections in both dimensions; such a reflective surface 50 may have a single focal point off-center from the reflective surface 50.

In operation, the solar concentrator system 48 reflects and focuses incident light onto the absorber 55 to convert the light into usable electrical energy. As discussed below, the solar concentrator system 48 may alternatively be used to concentrate and collect any concentratable phenomena. Referring now to FIG. 5, incident light rays 90 may strike the reflective surface 50 and reflect, converging on the absorber 55 positioned at the focus of the reflective surface 50. Because the reflective surface 50 is a parabolic side section, the absorber 55 may be out of the path of the incident light rays 90.

Figure 6:
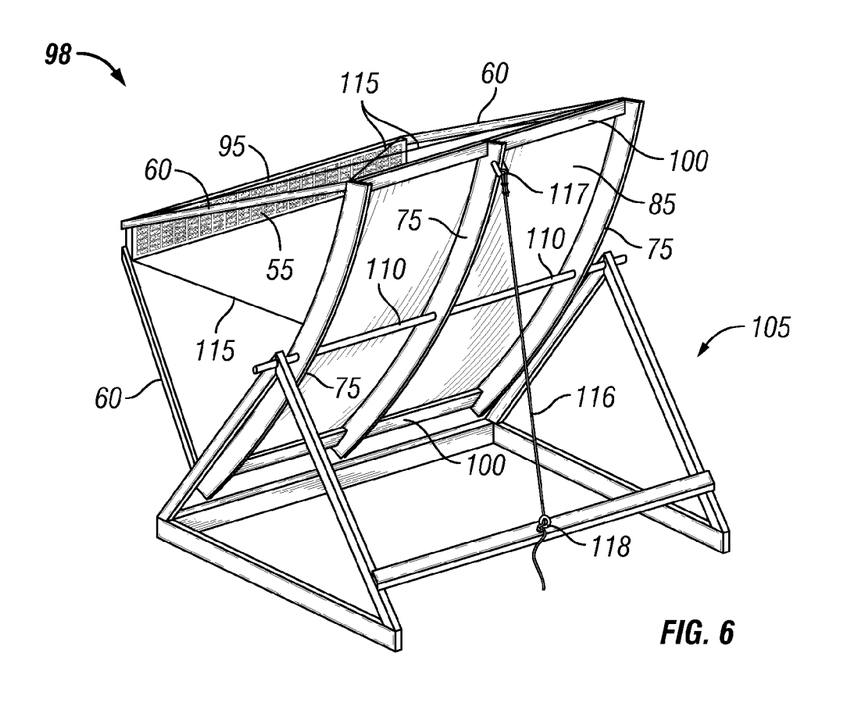
FIG. 6 is a rear view of a single-axis tracking device and concentrator.
Figure 8:
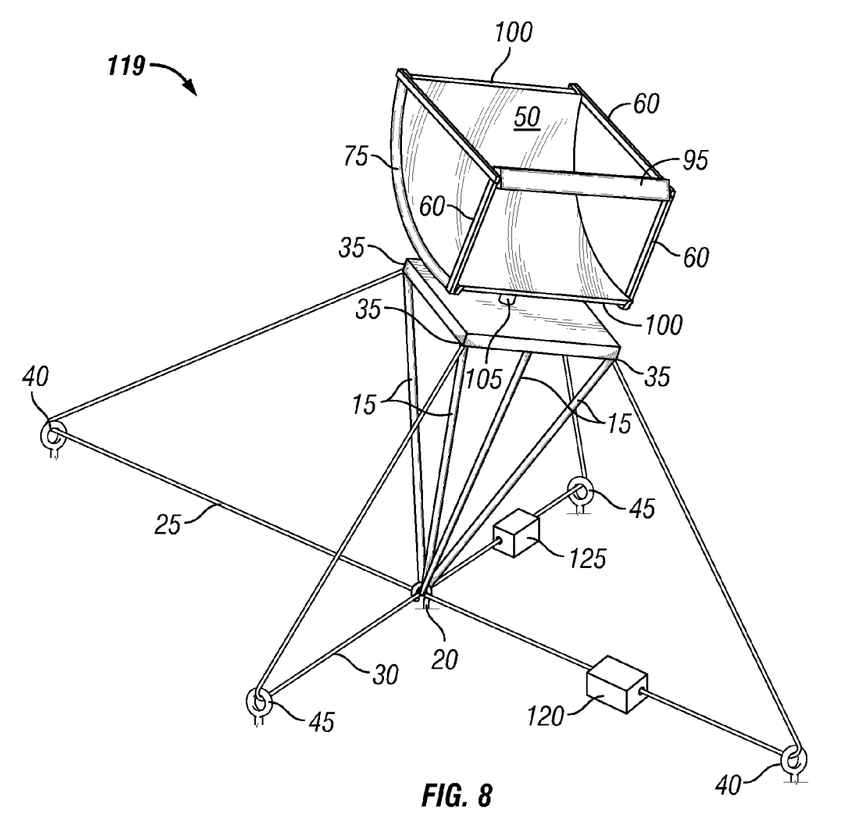
FIG. 8 depicts a dual-axis tracking system and solar collector assembly.

Embodiments of the solar concentrator system 48 can be combined with trackers, such as the embodiments of single or dual-axis solar trackers 1, 98, or 119 disclosed herein. In such combinations, the reflective surface 50 may be pointed toward the sun through the course of each day, such that the sunlight 90 is incident to the reflective surface 50 at a roughly constant angle throughout the day. Alternatively, the reflective surface 50 could be fixedly positioned in alignment with the path of the sun as it moves across the sky. Due to the nature of the curved reflective surface 50, incident light 90 may converge on the absorber 55 even as the sun moves relative to the solar concentrator system 48 during the course of a day.

In operation of the embodiment comprising an absorber 55 mounted on a slider within the absorber bracket 95, described above, the absorber 55 may be moved along the focus line throughout the day to remain at the point of convergence of reflected sunlight.

Embodiments of two-dimensional parabolic collectors, described above, may concentrate reflected sunlight to a point that is outside the incident light beam pathway, so that the absorber 55 does not shade the reflective surface 50. This two-dimensional collector may achieve a higher concentration ratio than a typical one-dimensional concentrator, thereby reducing the amount of solar cell area required and lowering costs.

Figure 7:
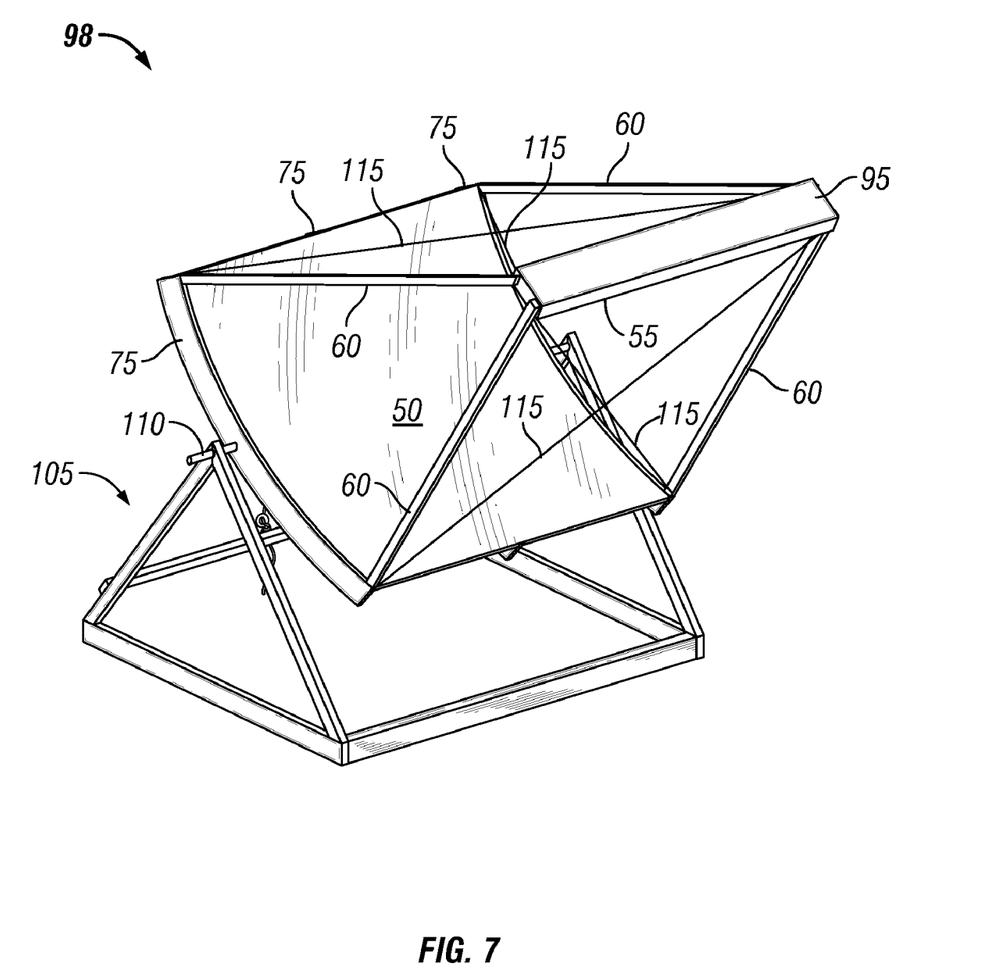
FIG. 7 is a side view of the single-axis tracking device and concentrator.

FIGS. 6 and 7 illustrate a single-axis tracking device and concentrator assembly 98 including a parabolic reflective surface 50. In the illustrated embodiment, the reflective surface 50 is supported and held in place by parabolic support ribs 75. The ribs 75 form the curved shape of the reflective surface 50. A thin sheet of material 85 is placed between the parabolic ribs 75 and the reflective surface 50 to form the backing of the reflective surface 50. This sheet 85 also forms a semi-monocoque system, serving as a structural element to further rigidize the assembly 98. Horizontal supports 100 provide rigidity and stability to the reflective surface 50 and structure of the assembly 98. A cylindrical hinge bar 110 passes through the ribs 75 and a support frame 105, providing rotation between the ribs 75 and the support frame 105. The support frame 105 is a triangular frame that forms the base of the assembly 98.

Absorber supports 60 attach to the support ribs 75 at the corners of the reflective surface 50 and connect to the absorber bracket 95. The absorber bracket 95 holds the absorber 55 at the focus of the reflective surface 50. Cross brace guy wires 115 extending across the front of the reflective surface 50 from the absorber bracket 95 to support ribs 75 provide rigidity to the absorber supports 60 to maintain the spatial relationship of the reflective surface 50 and absorber 55. A fixed end of cable 116 attaches to a support rib 75 at 117 above the hinge bar 110 behind the reflective surface 50. The cable 116 has a loose end that may be secured to the support frame 105 at cable tie-down 118.

In another embodiment of the single-axis tracking device and concentrator assembly 98, the assembly omits the support frame 105, but instead may be propped up against rocks, sticks, or other objects. Another embodiment includes a motor connected to cable 116 to apply or release tension on the cable 116 to adjust the angle of inclination.

As with other embodiments described in this disclosure, the single-axis tracking device and concentrator assembly 98 is constructed from various components that may be disassemblable, or assembly thereof may be permanent once assembled.

In some embodiments of the assembly 98, guy wire 115 comprises nylon strands. In other embodiments, guy wire 115 may be fishing line, string, or other types of synthetic or natural fibers or combinations thereof.

In operation, the single-axis tracking device and concentrator assembly 98 may track a stationary or moving target object, such as the sun, and thereby point the reflective surface 50 at the target object. Applying a downward force to cable 116 causes the reflective surface 50 to tilt upward around the hinge bar 110. Releasing tension on the cable 116 allows the weight of the reflective surface 50 and absorber 55 to cause the reflective surface 50 to tilt downward. The cable 116 may be tied or otherwise secured to the cable tie-down 118 to maintain the reflective surface 50 at a selected inclination relative to the sun or other object being tracked. The single-axis tracking device and concentrator assembly 98 may be placed with the reflective surface 50 facing the sun at an angle of inclination adjusted, thereby pointing the reflective surface 50 toward the sun. As the sun moves during the day, the angle of inclination may be adjusted periodically by unsecuring the cable 116 from the tie-down 118, selectively manually pulling the cable 116 downward or releasing tension on the cable 116, and re-securing the cable 116 to the tie-down 118. In addition to tilting the reflective surface 50, the entire assembly 98 may periodically be manually rotated on the ground to track the sun or other target object. A motor or other actuator may be used to selectively apply or release tension on the cable 116 to provide automatic tracking of the target object.

FIG. 8 illustrates a dual-axis solar tracking system and solar collector assembly 119 including a reflective surface 50 supported by a thin sheet (not shown) and parabolic ribs 75. In the illustrated embodiment, absorber supports 60 hold an absorber bracket 95 with absorber 55 in place at the focus of the reflective surface 50. A support frame 105 is rigidly connected to one or more parabolic ribs 75 behind the reflective surface 50. The support frame 105 includes a flat platform that connects to cables 25 and 30 at corners 35. Similar to the dual-axis tracking system 1 depicted in FIG. 1, supports 15 hold the support frame 105 off the ground and connect to pivoting anchor point 20. As described in reference to the dual-axis tracking system 1, cable 25 passes through stakes 40 and connects at opposite corners 35. Cable 30 passes through stakes 45, being roughly perpendicular to cable 25, and connects at opposite corners 35.

The assembly 119 includes housings 120 and 125 that house motors engaged with cables 25 and 30, respectively. The motors are placed in housings 120 and 125 to protect them from the elements. The housings 120 and 125 are secured to the ground with a stake or the like. In other embodiments, housings 120 and 125 house motors and are placed anywhere along the cables 25 and 30 as desired.

In another embodiment, the pivot stake at 20 passes through a hole in the housings 120 and 125 to secure the housings 120 and 125 in place. Alternatively, the motor housings 120 and 125 are attached to the stake 20 with a fastener, adhesive, or other such attachment method. An alternative embodiment comprises one or more cable tensioners located within the housings 120 and 125 or elsewhere along the cable path. The tensioners provide sufficient tension along the cables 25 and 30 to maintain the inclination of the reflective surface 50.

In operation, the dual-axis solar tracking system and solar collector assembly 119 is used to point the reflective surface 50 at the sun or other target. The motors within housings 120 and 125 engage cables 25 and 30 to apply tension thereto and thereby tilt the reflective surface 50 and maintain its orientation with respect to the sun or other target. The motors provide tension on the cables 25 and 30 to maintain the desired inclination of the reflective surface 50. While the reflective surface 50 is tilted, the motors and/or tensioners may support the weight of the tilted reflective surface 50 by maintaining tension in the cable 25 or 30, thereby keeping the reflective surface 50 tilted at the desired angle.

In embodiments of the assembly 119, the motors are controlled via an electronic circuit. If the target is the sun, the circuit comprises a microprocessor, a photosensor, motor drivers, and other necessary components. The circuit may use other control means, such as software for following the known path of the sun, or a camera and image processing software. The control means can be used to track objects other than the sun, such a ball, person, star, moon, or other moving object. In other embodiments, the system 119 may also be hand-tracked, tracked by differential pressure, or tracked by any other method.

Figure 9:
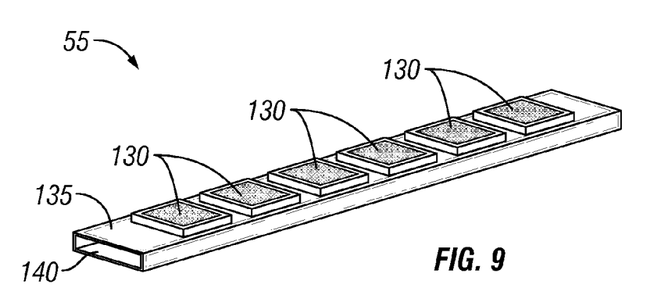
FIG. 9 depicts a solar absorber comprising an array of solar cells mounted on a coolant pipe.

FIG. 9 shows an embodiment of an absorber 55, in which the absorber 55 comprises an array of solar cells 130 mounted on a coolant pipe 135. The solar cells 130 are wired in series, split into groups, or wired in combinations thereof to obtain a desired output voltage. In an example, 6.5 Volt open circuit cells are used, and are wired in groups of three. In the concentrated sunlight, these exemplary groups may output about 15 Volts at max power, which may be useful for charging and running many small devices. Groups can also be wired in parallel to generate the desired amount of power. Alternatively, any type of solar cells 130 or arrays that can withstand increased heat and power levels can be used, and they can be selectively wired to output a desired voltage and power.

The coolant pipe 135 serves as the support for the solar cell array 130, and can also carry a liquid coolant. In an embodiment, the pipe 135 is made of thin aluminum, but alternate embodiments comprise a coolant pipe 135 made of any reasonably stiff and heat-conductive material or combination of materials. The open ends 140 can be attached to an existing coolant delivery system, such as a pump. Alternatively, the pipe 135 could consist of a bar or a bar with fins, and dissipate heat through convection only with no coolant. In an embodiment, thermal compound is used between the cells 130 and the coolant pipe 135 to increase the rate of heat transfer from the panels to the coolant. The solar cells 130 can be adhesively attached to the coolant pipe 140, such as with silicone or with a thermal compound adhesive. Alternatively, the absorber 55 could consist of a dark colored pipe with a working fluid to absorb and carry heat out of the system, such as for use as a Stirling engine or steam distiller. Alternatively, the absorber 55 could be a flat plate to be heated directly, such as for use as a cooking device.

The tracking systems of the present disclosure may have one or more advantages over conventional tracking systems. For example, the systems disclosed herein can be compact and light enough to be easily carried, and they can be versatile (e.g., may be used with a variety of objects, including telescopes, cameras, stiff solar concentrators and modules, flexible solar modules, and other objects). In addition, the systems of the present disclosure can function reliably, and they can be relatively inexpensive to manufacture and maintain.

As mentioned above, the tracking and concentrator systems disclosed herein are designed to be portable, and can be packed in a number of ways depending on the embodiment. In the embodiments shown herein, the disassembled systems can be shipped flat, and multiple systems can be stacked for efficient shipping and storage. Thus, assembled systems could be broken down into constituent components for transportation. Alternatively, the systems could be folded for easy redeployment, such as by detaching and folding in the absorber supports 60, 65, and 70 of the solar concentrator system 48. Flexible components of the systems disclosed herein may be folded, rolled, or otherwise collapsed. Such a system could easily be made to fit into available space, such as in a pack, in the trunk of a vehicle, strapped to a pack, or other transportation means.

Components of the systems disclosed herein can be cut from a flat sheet of material during manufacture. Thus, they can be cheaply manufactured by punching, die cutting, laser cutting, or other industrial process. In addition, such components ship flat to reduce shipping cost.

The systems of the present disclosure may be unrolled or unfolded quickly to provide readily available, portable power. The power and/or heat from the concentrator can power the tracking system. Alternatively, an outside power source, such as a battery for the circuit or a heat source or compressed fluid for the differential pressure, can be used to drive the tracking. Due to the range of possibilities for transportation, the systems of the present disclosure may lend themselves to adaptation to many different sizes of systems and levels of portability. For instance, a person could carry a small system into the backcountry to charge and run a cell phone or other small electronics. A personal vehicle could carry a medium sized system into the field to power such things as drills, water pumps, or research equipment. A truck could carry a large system suitable for industrial or military use. The systems of the present disclosure can also be applied to stationary uses both grid-connected, such as solar farms, rooftops, and other applications, and off-grid such as for a village, settlement, electric signpost, factory, etc.

While the foregoing discussion mainly references to solar energy collection for ease of explanation, the concepts of the present disclosure could also be applicable to collection of other types of electromagnetic radiation, sound waves, small or subatomic particles, and other such concentratable phenomena.

While the embodiments have been described in detail, it will be apparent to one skilled in the art that various changes and modifications can be made therein without departing from the spirit and scope thereof. Accordingly, it is intended that the present disclosure covers the modifications and variations thereof, provided they come within the scope of the appended claims and their equivalents.

What is claimed is:

1. A tracking system, comprising:
a platform configured to accommodate an object;
at least one support leg attached to the platform, the at least one support leg having a pivoting anchor point situated away from said platform; and
at least one flexible cable attached to the platform,
wherein the at least one flexible cable passes through a fixed anchor point, wherein the platform is adapted to pivot at the pivoting anchor point in response to a tension applied to the at least one flexible cable, and wherein said pivoting anchor point allows tracking along separate axes.

2. The tracking system of claim 1, wherein the fixed anchor point is positioned away from the tracking system.

3. The tracking system of claim 1, wherein the at least one-flexible cable passes through at least two anchor points and secures to at least two sides of the platform.

4. The tracking system of claim 1, wherein the object is a solar collector, telescope, a camera, or a satellite dish.

5. The tracking system of claim 1, whereby the pivoting anchor point is positioned on the at least one support leg away from the platform.

6. The tracking system of claim 1, wherein the apparatus pivots around at least two axes of rotation.

7. The tracking system of claim 1, further including a solar concentrator mounted on the platform, wherein the solar concentrator comprises:
a reflective surface having a curved shape and a focal point above the reflective surface,
wherein the reflective surface comprises a flexible sheet of reflective material; a reinforcement sheet supporting the reflective material, wherein the reinforcement sheet is stiffer than the reflective material; a plurality of curved ribs attached to the reinforcement sheet; and an absorber located at the focal point.

8. The tracking system of claim 7, wherein the reflective material comprises aluminized Mylar adhesively attached to the reinforcement sheet.

9. The tracking system of claim 7, wherein the absorber comprises photovoltaic cells.

10. A method of collecting solar energy, comprising:
assembling a portable solar concentrator at a first location, said portable solar concentrator having a tracking system as in claim 1;

collecting concentrated solar energy at the first location using the portable solar concentrator;

transporting the portable solar concentrator to a second location; and collecting concentrated solar energy at the second location using the portable solar concentrator.

11. The tracking system of claim 1, wherein said separate axes are longitudinal and latitudinal axes.

12. A portable solar concentrator, comprising:

a reflective surface having a curved shape and at least one focal point above the reflective surface, wherein the reflective surface comprises a flexible sheet of reflective material;

a reinforcement sheet supporting the reflective material, wherein the reinforcement sheet is stiffer than the reflective material;

a plurality of curved ribs attached to the reinforcement sheet;

an absorber located at the at least one focal point; and a support stand hingedly connected to the curved ribs, wherein the curved ribs, reinforcement sheet, and reflective material may swivel relative to the support stand on a roughly horizontal axis;

wherein the portable solar concentrator is adapted to track a target along separate axes by applied tension to cables attached to a platform of the portable solar concentrator, which cables pivot said platform about an anchor point situated away from said platform.

13. The portable solar concentrator of claim 12, wherein the shape of the reflective surface is a parabolic side section.

14. The portable solar concentrator of claim 12, wherein said separate axes are longitudinal and latitudinal axes.

* * * * *